United States Patent

Van Roermund et al.

[11] Patent Number: 5,373,243
[45] Date of Patent: Dec. 13, 1994

[54] IMPEDANCE TRANSFORMATION CIRCUIT WITH MATCHED CURRENT SOURCES

[75] Inventors: Arthur H. M. Van Roermund; Johan H. I. Hendrickx, both of Eindhoven, Netherlands

[73] Assignee: U.S. Philips Corporation, New York, N.Y.

[21] Appl. No.: 943,367

[22] Filed: Sep. 10, 1992

[30] Foreign Application Priority Data

Sep. 26, 1991 [EP] European Pat. Off. ........ 91202495.7

[51] Int. Cl.$^5$ ................................................. G05F 5/00
[52] U.S. Cl. .................... 324/605; 324/713; 323/315; 330/282
[58] Field of Search ............... 323/315, 364; 324/649, 324/652, 605, 607, 705, 713; 330/282; 333/124, 213, 214, 215, 216, 217; 307/491, 540

[56] References Cited

U.S. PATENT DOCUMENTS

| | | | |
|---|---|---|---|
| 3,828,281 | 8/1974 | Chambers, Jr. | 333/213 |
| 4,220,875 | 9/1980 | Lawton | 333/217 |
| 4,339,729 | 7/1982 | Jason et al. | 330/294 |
| 4,363,008 | 12/1982 | Chambers, Jr. | 333/213 |
| 4,517,508 | 5/1985 | Sakai | 323/352 |
| 4,591,739 | 5/1986 | Nagano | 323/311 |

FOREIGN PATENT DOCUMENTS 55-64418  5/1980  Japan ................................... 333/213

Primary Examiner—Kenneth A. Wieder
Assistant Examiner—Christopher M. Tobin
Attorney, Agent, or Firm—Bernard Franzblau

[57] ABSTRACT

An impedance transformation circuit for transforming a two-pole electrical impedance (Z) includes a first controllable current source for producing a current ($I_1$) flowing through the impedance during operation. An operational amplifier is coupled to the first current source for providing a control signal ($V_0$) corresponding to the impedance current ($I_1$). A second controllable current source is coupled to the operational amplifier for providing at an input terminal of the circuit a further current ($I_2$) proportional to the impedance current ($I_1$) as a function of the control signal ($V_0$). As a result of using a first and second controllable current source and applying the control signal delivered by the operational amplifier to the control inputs of the two current sources, an impedance transformation is obtained which is dependent on similar parameter ratios. The circuit is suitable for use as an integrated semiconductor circuit.

21 Claims, 3 Drawing Sheets

IMPEDANCE TRANSFORMATION CIRCUIT WITH MATCHED CURRENT SOURCES

BACKGROUND OF THE INVENTION

This invention relates to an impedance transformation circuit for transforming a two-pole electrical impedance, comprising first means for measuring the current flowing through the impedance during operation, second means coupled to the first means for providing a control signal corresponding to the measured current, and third means coupled to the second means for providing a further current proportional to the measured current to an input terminal of the circuit as a function of the control signal. Said further current therefore affects the impedance behaviour of the circuit at the input connection point.

An impedance transformation circuit of this type is used, inter alia, in voltage-controlled oscillators, adjustable electric filters, accurate low-frequency filters, frequency-dependent control circuits and the like, and is disclosed by U.S. Pat. No. 4,339,729.

In the impedance transformation circuit known in practice, the problem arises that the electrical behaviour of the first means for measuring the current through the impedance to be transformed is determined by other physical parameters or a different number of physical parameters from the electrical behaviour of the third means for providing the proportional further current at the input terminal. The accuracy of the impedance transformation is consequently dependent on spreads in the components used for the first and third means, differences in the temperature behaviour of said components, aging and the like. Although the parameter sensitivity can be reduced by using compensation techniques known per se, this leads quite quickly to relatively complex and expensive electronic circuits.

SUMMARY OF THE INVENTION

An object of the invention is consequently to provide an impedance transformation circuit of the type mentioned at the outset which is suitable for manufacture as an integrated circuit and which is to a large extent insensitive to inaccuracies and spreads in the manufacturing process, and without the need to use separate compensation circuits.

According to the invention, this is achieved in that the first and third means comprise a first current source and a second current source, respectively, each provided with a control input for adjusting the current delivered by the respective current source, the control signal delivered by the second means being connected to the control input of the first current source and the second current source.

As a departure from the prior art, in which use is made of a reference resistor in combination with an amplifier to measure the current through the impedance to be transformed, in the circuit according to the invention use is made of current sources controlled in the same way both to measure the current through the connected impedance and to provide the further current to the input terminal as a function of said current, the electrical properties of said controlled current sources being determined by similar parameters.

The circuit according to the invention is based on the insight that a high degree of process independence can be achieved by constructing and controlling the first means for measuring the current through the impedance and the third means for providing the proportional further current to the input terminal in the same way.

The electrical behaviour of the circuit according to the invention is now only a function of similar parameter ratios which are constant over the operating range of the circuit. An optimum parameter independence is obtained by means of current sources of similar type.

In a further embodiment of the circuit according to the invention, the second means for providing a control signal corresponding to the measured current comprise an amplifier having an output which is coupled to the control input of the first current source and the second current source, and having an input which is connected to an impedance terminal, the current path of the first current source being coupled to the impedance terminal and the current path of the second current source being coupled to the input terminal, and the input terminal and impedance terminal being designed for connecting the two-pole electrical impedance to be transformed.

Neglecting the input current of the amplifier, which should be as small as possible, the current through the impedance to be transformed is equal to the current in the first current source which is in turn dependent on the output signal of the amplifier. Said output signal, which is a measure of the current through the impedance to be transformed, now controls the second current source. The current through said second current source is consequently proportional to the current through the respective impedance. The current at the input terminal is now determined by the current through the respective impedance and the current of the second current source. Seen from the input terminal, the circuit according to the invention consequently behaves in an equivalent manner to the connected impedance, however with a value deviating therefrom.

Preferably, the amplifier is an operational amplifier having an inverting input which is connected to the impedance terminal and having a noninverting input which is connected to a signal ground terminal of the circuit.

In yet a further embodiment of the circuit according to the invention, fourth and fifth means are provided for varying the current delivered by the first current source and the second current source, respectively, as a function of a first adjustment signal and a second adjustment signal, respectively. The value of the transformed impedance can be accurately adjusted at the input terminal by suitably supplying the adjustment signal.

In a first embodiment based thereon, the fourth and fifth means comprise a first current splitter and a second current splitter, respectively, connected in series with the current path of the first current source and the second current source, respectively, each current splitter being provided with a control input for applying the first adjustment signal and the second adjustment signal, respectively.

In a second embodiment, the said fourth and fifth means comprise a first multiplier and a second multiplier, respectively, for providing a control signal multiplied by the first adjustment signal and the second adjustment signal, respectively, to the control input of the first current source and the second current source, respectively.

Constructing said fourth and fifth means similarly achieves the result that the adjustment or regulation of the circuit is also at the same time dependent on ratios between similar parameters and not on absolute process variables. Deriving the adjustment signals from a common source, for example, from the supply voltage of the circuit, produces as constant an impedance value as possible at the input terminal.

The impedance transformation circuit according to the invention is suitable, in particular, for design as an integrated semiconductor circuit. For example, an integrated semiconductor circuit comprising field-effect transistors of the insulated-gate type.

BRIEF DESCRIPTION OF THE DRAWING

The invention will be explained below in greater detail by reference to the accompanying drawing, in which.

DESCRIPTION OF THE PREFERRED EMBODIMENTS

Figure 1:
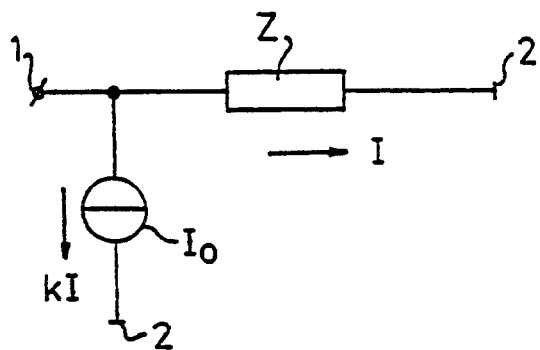
FIG. 1 shows a schematic diagram of the impedance transformation underlying the invention.

The principle of the impedance transformation underlying the invention, or impedance multiplication, is shown in FIG. 1.

Connected between an input terminal 1 and a signal ground terminal 2 are an impedance Z to be transformed and a current source $I_0$. The current source $I_0$ delivers a current which is a factor k of the current through the impedance Z.

The apparent impedance of the circuit between the input terminal 1 and the signal ground terminal 2 is therefore determined by the sum of the current I through the impedance Z and the current kI in the current source $I_0$. The factor k may have an arbitrary real or complex value.

Figure 2:
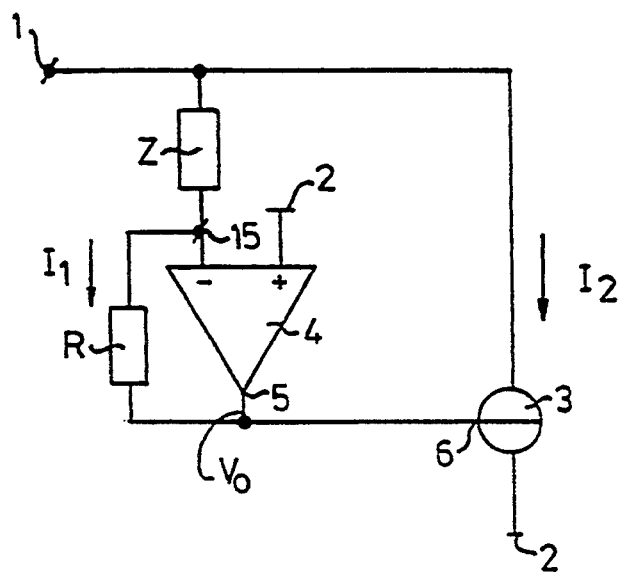
FIG. 2 shows the schematic diagram of an impedance transformation circuit based on the prior art.

FIG. 2 shows the schematic diagram of an impedance transformation circuit based on the prior art. The circuit comprises an operational amplifier 4 having a noninverting input (+) which is connected to the signal ground of the circuit, an inverting input (−) which forms an impedance terminal 15, the impedance Z to be transformed being connected between the latter and the input terminal 1, and an output 5. A first electrical circuit in the form of a measuring resistor R for measuring the current through the impedance Z is connected between the output 5 and the inverting input (−). Connected between the input terminal and the signal ground 2 is a second electrical circuit in the form of a controllable current source 3. The current source 3 has a control input 6 which is connected to the output 5 of the amplifier 4. The current in the current source 3 is a function of the control signal supplied to the control input 6.

Assuming an ideally operating operational amplifier 4, the current $I_1$ through the measuring resistor R is equal to the current through the impedance Z. The output voltage of the amplifier 4 is consequently determined by the product of the current $I_1$ and the value of the measuring resistor R. Because the current $I_2$ in the current source 3 is dependent on the control voltage supplied, that is to say the output voltage $V_0$ of the amplifier 4, the apparent impedance at the input terminal 1 can be adjusted by varying the value of the resistor R or the current $I_2$ of the current source 3.

This circuit has the disadvantage that the transformed impedance is a function of several different physical parameters and it is thus sensitive to inaccuracies and spreads in the chosen components, or in the manufacturing process in the case of an integrated semiconductor circuit. The measured current $I_1$ through the impedance Z is dependent, inter alia, on the physical behaviour of the resistor R, while the current $I_2$ in the current source 3 is a function of the conversion of the output voltage $V_0$ of the operational amplifier 4 into a current, that is to say of a transconductance parameter, which depends on the structure of the current source for achieving said voltage/current conversion.

Although a transformation behaviour which is reasonably constant over the operational range of the circuit can be achieved by using compensation circuits, this results quite rapidly in complex, extensive circuits having the disadvantages associated therewith as regards physical size and sensitivity to inaccuracies and spreads in the manufacturing process.

Figure 3:
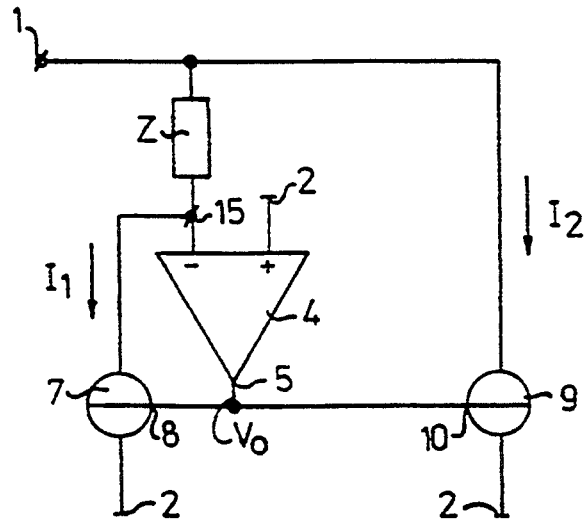
FIG. 3 shows the schematic diagram of an embodiment of an impedance transformation circuit in accordance with the invention.

FIG. 3 shows the schematic diagram of an embodiment of the circuit according to the invention. Analogously to FIG. 2, the circuit is built up around an operational amplifier 4, but instead of a first circuit in the form of a measuring resistor R, a first controllable current source 7 is connected between the inverting input (−) and the signal ground 2 of the circuit and is provided with a control input 8 which is connected to the output 5 of the operational amplifier 4. The second circuit for varying the current at the input terminal 1 comprises a second controllable current source 9 having a control input 10, which second current source 9 is connected in a similar manner to the current source 3 in FIG. 2.

Again, assuming an ideally operating operational amplifier 4, a current $I_1$, which is equal to the current through the impedance Z, flows in the first current source 7 during operation. The output voltage $V_0$ associated therewith at the output 5 of the operational amplifier 4 is also applied to the control input 10 of the second current source 9 and consequently determines the current $I_2$ thereof. In the circuit according to the invention, both the current $I_1$ flowing in the first circuit and the current $I_2$ flowing in the second circuit are a function of a transconductance parameter, namely that originating from the voltage/current conversion of the first current source 7 and the second current source 9, respectively. It can readily be deduced that the apparent or transformed impedance $Z_i$ at the input terminal 1 is determined by the ratios of the transconductance parameters of the first current source 7 and the second current source 9. $Z_i$ is in fact given by:

$$Z_i = (1 + I_2/I_1)^{-1} Z, \text{ with}$$

$$I_1 = g_{m1} V_0, \text{ and}$$

$$I_2 = g_{m2} V_0,$$

it then follows that:

$$Z_i = (1 + g_{m2}/g_{m1})^{-1} Z,$$

where:
$g_{m1}$ = the transconductance parameter of the first current source 7 and
$g_{m2}$ = the transconductance parameter of the second current source 9.

In the case where the impedance Z comprises, for example, a capacitance C, the transformed impedance behaves like a capacitance having the value $(1+g_{m2}/g_{m1})C$.

In the circuit according to the invention, the physical behaviour of the transformed impedance is therefore determined by a ratio of similar parameters, in this case the transconductance parameters of the current sources 7 and 9. The accuracy of the impedance transformation therefore no longer depends on the absolute parameter values but is determined by the ratio of parameters, that is to say matching parameters. This is advantageous, in particular, for design as an integrated semiconductor circuit.

Figure 4:
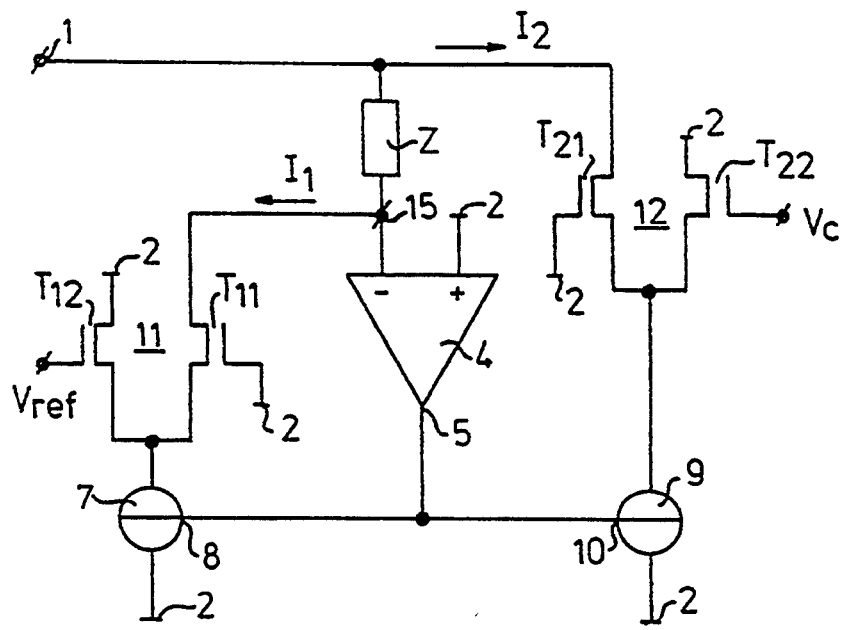
FIG. 4 shows an embodiment of the circuit in accordance with FIG. 3, designed for electrically adjusting or regulating the value of the transformed impedance.

FIG. 4 shows a further embodiment of the circuit according to the invention, based on the diagram in accordance with FIG. 3, in which further embodiment a first controllable current splitter 11 and a second controllable current splitter 12, respectively, are incorporated in series with the first current source 7 and the second current source 9.

In the embodiment shown, the two current splitters 11, 12 are implemented with the aid of field-effect transistors of the insulated-gate type. The first current splitter 11 comprises a n-channel transistor $T_{11}$ whose drain is connected to the inverting input (−) of the amplifier 4 and whose source is connected to a terminal of the first current source 7. The gate of transistor $T_{11}$ is connected to the signal ground 2 of the circuit. The circuit further comprises a second n-channel transistor $T_{12}$ whose drain is connected to said terminal of the first current source 7 and whose source is connected to the signal ground 2. The gate of the transistor $T_{12}$ forms a terminal for the application of a first adjustment voltage $V_{ref}$. The second current splitter 12 is constructed in a similar way and comprises an n-channel transistor $T_{21}$ whose drain is connected to the input terminal 1 and whose source is connected to the terminal of the second current reference source 9. The gate of transistor $T_{21}$ is connected to the signal ground 2. Connected to the source of the transistor $T_{21}$ is the drain of a further n-channel transistor $T_{22}$, having its source connected to the signal ground 2 and its gate designed for the application of a second adjustment voltage $V_c$.

Depending on the values of the respective adjustment voltages $V_{ref}$ and $V_c$, a larger or smaller proportion of the current of the associated current source 7 or 9, respectively, will drain to the signal ground 2 via the transistor $T_{12}$ or $T_{22}$, respectively. If the adjustment voltages $V_{ref}$ and $V_c$ have a value which is less than the potential of the signal ground, the current of the respective current sources 7, 9 flows completely through the transistor $T_{11}$ or $T_{21}$, respectively. In the event of complete saturation of the transistors $T_{12}$ and $T_{22}$ by means of their respective adjustment voltages $V_{ref}$ and $V_c$, approximately half the current of the associated current source will flow through each of the transistors of the respective current splitter.

Assuming that:

$$I_1 = \alpha_1 V_{ref},$$

$$I_2 = \alpha_2 V_c,$$

the impedance $Z_i$ at the impedance terminal point 1 is given by:

$$Z_i = (1 + KV_c/V_{ref})^{-1} Z, \text{ with}$$

$$K = (g_{m2}\alpha_2)(g_{m1}\alpha_1)$$

where:
$\alpha_1$ = transconductance parameter of first current splitter 11 and
$\alpha_2$ = transconductance parameter of second current splitter 12.

It is therefore again the case that the transformed impedance is a function only of parameter ratios and not of absolute process variables.

Figure 5:
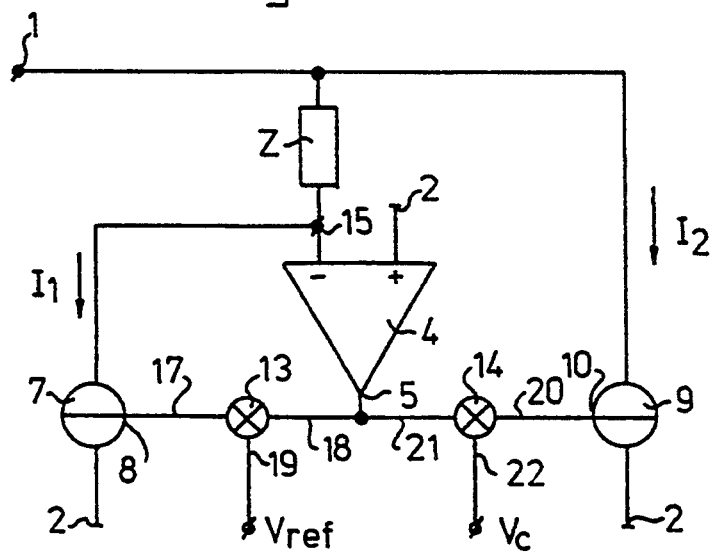
FIG. 5 shows a further embodiment of the circuit in accordance with FIG. 3, designed for electrically adjusting or regulating the value of the transformed impedance.

FIG. 5 shows a variation of the circuit in accordance with FIG. 3, in which the control input 8 of the first current source 7 is connected to an output 17 of a first voltage multiplier 13 which is provided with a first input 18 connected to the output 5 of the amplifier 4 and with a second input 19 designed for the application of a first adjustment voltage $V_{ref}$. The control input 10 of the second current source 9 is connected to a second voltage multiplier 14 having a first input 21 connected to the output 5 of the amplifier 4 and a second input 22 designed for the application of a second adjustment voltage $V_c$. The control voltage at the control input 8 of the first current source 7 and at the control input 10 of the second current source 9 can be varied by means of the two adjustment voltages $V_{ref}$ and $V_c$, and this results in a variation of the current in the associated current source. It will be clear that, as a result of using a multiplier to vary the current in both circuits, the transformed impedance is once again a function of similar parameter ratios, that is to say of matching.

Figure 6:
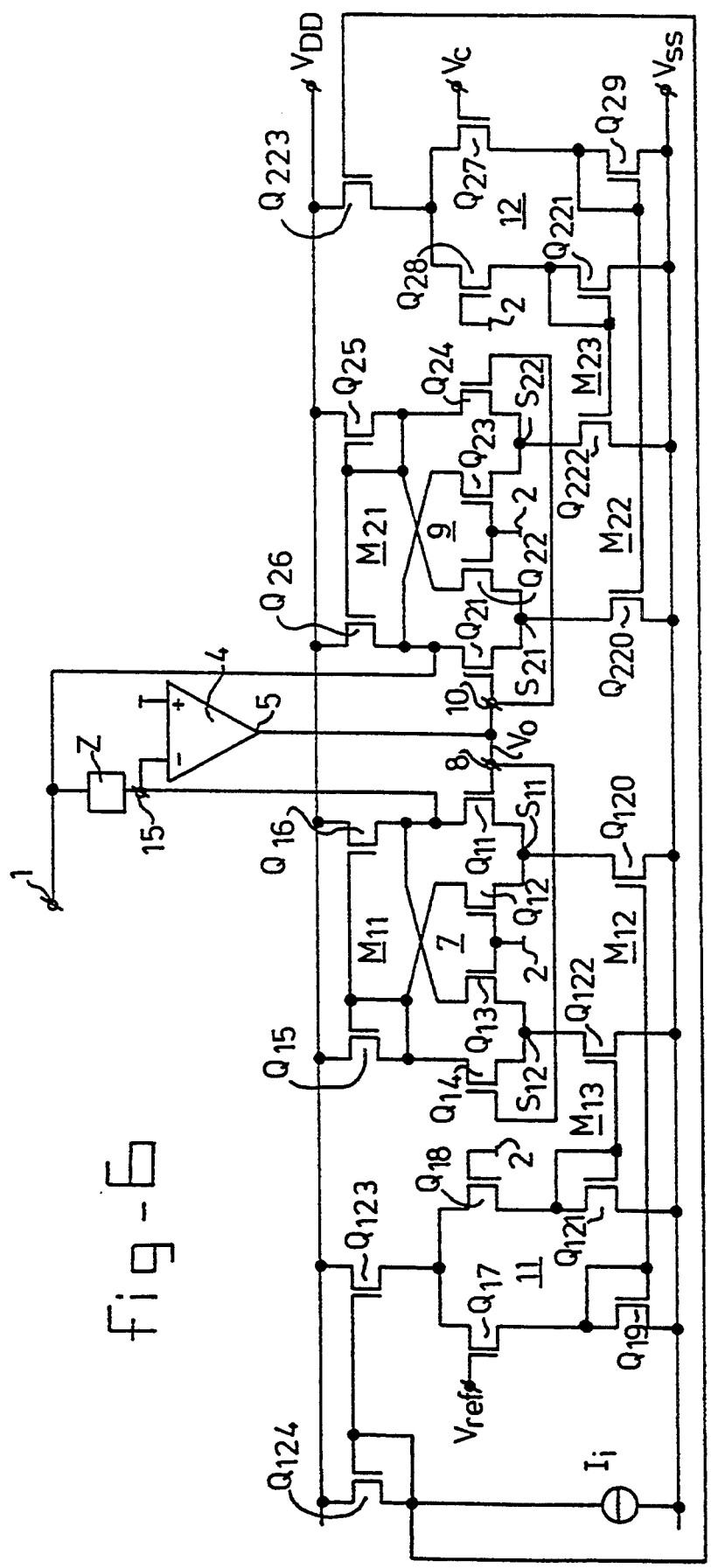
FIG. 6 shows an embodiment of the impedance transformation circuit in accordance with the invention according to the schematic diagram of FIG. 4.

FIG. 6 shows an embodiment of the impedance transformation circuit based on the schematic diagram in accordance with FIG. 4, which embodiment is suitable, in particular, for manufacture as an integrated semiconductor circuit. The integrated operational amplifier 4, which is shown symbolically in FIG. 6 for the sake of clarity, may be of a known type. In addition, an impedance Z is shown only for the purpose of clarification.

The circuit is made up of field-effect transistors of the insulated-gate type and comprises a first supply terminal $V_{DD}$ and a second supply terminal $V_{SS}$. The first and third means for respectively measuring the current through the impedance Z and for providing the further current at the input terminal 1 are completely symmetrical in construction, as can clearly be seen from FIG. 6. The first figure in the subscript of the transistors shown relates to their position in the first or third means, indicated respectively by a FIG. 1 or 2. In order to avoid duplication, only the structure and operation of one of the two circuits is discussed below. Apart from the first figure, transistors having the same subscripts fulfil the same function.

The first current source 7 is made up of a first and second transistor differential pair comprising the transistors $Q_{11}$ and $Q_{12}$ or the transistors $Q_{13}$ and $Q_{14}$, respectively. In the diagram shown, all of them are of the n-channel type. The sources of the transistors $Q_{11}$ and $Q_{12}$ are interconnected and form a first common source terminal $S_{11}$. The sources of the transistors $Q_{13}$ and $Q_{14}$ are also interconnected and form a second common source terminal $S_{12}$. The gate of the transistor $Q_{12}$ and the gate of the transistor $Q_{13}$ are interconnected and connected to the signal ground terminal 2 of the circuit. The gate of the transistor $Q_{11}$ and the gate of the transistor $Q_{14}$ are interconnected and form the control input 8 of the current source 7. The drain of the transistor $Q_{12}$ and the drain of the transistor $Q_{14}$ are connected to the drain of p-channel transistor $Q_{15}$ wired as a diode. The gate of said transistor $Q_{15}$ is connected to the gate of a p-channel transistor $Q_{16}$, which transistors jointly form a first current balance $M_{11}$. The sources of the two transistors $Q_{15}$ and $Q_{16}$ are connected to the first supply terminal $V_{DD}$. The drain of the transistor $Q_{11}$ and the drain of the transistor $Q_{13}$ are connected to the drain of the transistor $Q_{16}$, which is also connected to the inverting input (—) of the operational amplifier 4 and to the impedance terminal 15. The drain of transistor $Q_{26}$ is connected to the input terminal 1. The interconnected gates of the transistors $Q_{21}$ and $Q_{24}$ form the control input 10 of the second current source 9, which, together with the control input 8 of the first current source 7, is connected to the output 5 of the operational amplifier 4.

The transistors $Q_{17}$ and $Q_{18}$, both of the p-channel type, form the first controllable current splitter 11 as shown in FIG. 4. The gate of the transistor $Q_{18}$ is connected to the signal ground 2 of the circuit, while the gate of the transistor $Q_{17}$ is designed for the application of a first adjustment voltage $V_{ref}$. The gate of the corresponding transistor $Q_{27}$ is designed for the application of a second adjustment voltage $V_c$. The drain of the transistor $Q_{17}$ is connected to the input of the second current balance $M_{12}$, formed by the drain of a transistor $Q_{19}$ of the n-channel type wired as a diode. The gate of the transistor $Q_{19}$ is connected to the gate of the associated transistor $Q_{120}$, also of the n-channel type, whose drain is connected to the first common source terminal $S_{11}$. The sources of the transistors $Q_{19}$ and $Q_{120}$ are both connected to the second supply terminal $V_{SS}$. The drain of the transistor $Q_{18}$ is connected to the second common source terminal $S_{12}$ in a similar way via a third current balance $M_{13}$ made up of the n-channel transistors $Q_{121}$ and $Q_{122}$.

The sources of the two transistors $Q_{17}$ and $Q_{18}$ are connected to the drain of a further p-channel transistor $Q_{123}$ whose source is connected to the first supply terminal $V_{DD}$. The gate of the transistor $Q_{123}$ is connected to the gate of a p-channel transistor $Q_{124}$ whose main current path incorporates an adjustable current source $I_i$. The drain of the transistor $Q_{124}$ is furthermore connected to the gate of the transistor $Q_{223}$. Suitable adjustment current source circuits are known per se in the art.

The circuit operates as follows. Depending on the value of the two adjustment voltages $V_{ref}$ and $V_c$, a proportion of the current delivered by the adjustment current source $I_i$ will flow via the second and third current balances $M_{12}$, $M_{22}$; $M_{13}$, $M_{23}$ in the first current source 7 and the second current source 9, respectively. The currents in the respective common source terminals $S_{11}$, $S_{12}$; $S_{21}$, $S_{22}$ are adjusted under these circumstances as a function of, respectively, the current through the impedance Z and the current determined by the output voltage $V_0$ of the amplifier 4 which flows via the second current source 9 to the input terminal 1. A change in the output voltage of the amplifier 4, like a change in the first and second adjustment voltages $V_{ref}$ and $V_c$, results in a change in the current adjustment and consequently in the apparent impedance at the input terminal 1.

The circuit is not limited to the embodiment shown in FIG. 4. The current balances can also be implemented in other ways known per se. The respective transistors may also be of the opposite conduction type or comprise bipolar transistors, in which case the base, emitter and collector connections replace the gate, source and drain connections.

We claim:

1. An impedance transformation circuit for transforming a two-pole electrical impedance comprising: first means comprising a first current source connected in series circuit with the electric impedance to an input terminal of the impedance transformation circuit for producing a current flow ($I_1$) through the electric impedance during operation, second means coupled to the first current source for providing a control signal ($V_0$) corresponding to the impedance current ($I_1$), and third means comprising a second current source having an input coupled to the input terminal of the impedance transformation circuit and with the second current source also being coupled to the second means so as to provide a further current ($I_2$) proportional to the impedance current to the input terminal of the circuit as a function of the control signal, wherein the first current source and the second current source each include a control input for adjusting the current delivered by the respective current source, and means for coupling the control signal to the control input of the first current source and to the control input of the second current source.

2. An impedance transformation circuit for transforming a two-pole electrical impedance comprising: first means comprising a first current source for producing a current flow ($I_1$) through the electric impedance during operation, second means coupled to the first current source for providing a control signal ($V_0$) corresponding to the impedance current ($I_1$), and third means comprising a second current source coupled to the second means so as to provide a further current ($I_2$) proportional to the impedance current to an input terminal of the circuit as a function of the control signal, wherein the first current source and the second current source each include a control input for adjusting the current delivered by the respective current source, means for coupling the control signal to the control input of the first current source and to the control input of the second current source, and wherein the first current source and the second current source are of a similar type in which electric properties thereof are determined by similar parameters such that circuit operation is only a function of similar constant parameter ratios to produce a parameter independent transformation circuit.

3. An impedance transformation circuit for transforming a two-pole electrical impedance comprising: first means comprising a first current source for producing a current flow ($I_1$) through the electric impedance during operation, second means coupled to the first current source for providing a control signal ($V_0$) corresponding to the impedance current ($I_1$), and third means comprising a second current source coupled to the second means so as to provide a further current ($I_2$) proportional to the impedance current to an input terminal of the circuit as a function of the control signal, wherein the first current source and the second current source each include a control input for adjusting the current delivered by the respective current source, means for coupling the control signal to the control input of the first current source and to the control input of the second current source, and wherein the second means comprise an amplifier having an output at which the control signal appears and the coupling means couples the amplifier output to the control input of the first current source and to the control input of the second current source, said amplifier having an input which is connected to an impedance terminal, a current path of the first current source being coupled to the impedance terminal and a current path of the second current source being coupled to the input terminal, and wherein the input terminal and the impedance terminal are arranged for connection to the two-pole electrical impedance to be transformed.

4. An impedance transformation circuit according to claim 3, wherein the amplifier comprises an operational amplifier having an inverting input to which the impedance terminal is connected and having a noninverting input which is connected to a signal-ground terminal of the circuit.

5. An impedance transformation circuit according to claim 3, wherein the impedance transformation circuit comprises fourth and fifth means for varying the current delivered by the first current source and the second current source, respectively, as a function of a first adjustment signal ($V_{ref}$) and a second adjustment signal ($V_c$), respectively.

6. An impedance transformation circuit according to claim 5, wherein the fourth means and the fifth means comprise a first current splitter and a second current splitter, respectively, connected in series with the current path of the first current source and the current path of the second current source, respectively, each current splitter having a control input for receiving the first adjustment signal and the second adjustment signal, respectively.

7. An impedance transformation circuit according to claim 5, wherein the fourth and fifth means comprise a first multiplier and a second multiplier, respectively, for providing a first control signal multiplied by the first adjustment signal and a second control signal multiplied by the second adjustment signal, respectively, to the control input of the first current source and to the control input the second current source, respectively.

8. An impedance transformation circuit according to claim 5, wherein fourth and fifth means are of a similar type.

9. An impedance transformation circuit according to claim 6, wherein the first current source and the second current source each comprise a first transistor differential pair and a second transistor differential pair, respectively, having a first gate or base terminal and a second gate or base terminal, a common source or emitter terminal and a first drain or collector terminal and a second drain or collector terminal, the first gate or base terminal of the first differential pair and the second gate or base terminal of the second differential pair being interconnected and connected to a signal-ground terminal of the circuit, the second gate or base terminal of the first differential pair and the first gate or base terminal of the second differential pair being interconnected and connected to the output of the amplifier, the first drain or collector terminals being interconnected and the second drain or collector terminals being interconnected and being mutually coupled via a first current balance, and the first drain or collector terminals of the first and second current source respectively being connected to the inverting input ($-$) of the amplifier and to the input terminal, and wherein the first current splitter and the second current splitter each comprise a third transistor differential pair, whose gate or base terminals form the control input for receiving the first adjustment signal ($V_{ref}$) and the second ($V_c$) adjustment signal, respectively, whose drain or collector terminals are each coupled via a second current balance to the common source or emitter terminal of the first differential pair and the second differential pair, respectively, of the first current source and the second current source, respectively, and whose common source or emitter terminal is coupled to an adjustment current source ($I_1$).

10. An impedance transformation circuit according to claim 9, wherein the transistors are all of the insulated-gate type constructed as an integrated semiconductor circuit.

11. An impedance transformation circuit for transforming a two-pole electrical impedance comprising: first means comprising a first current source for producing a current flow ($I_1$) through the electric impedance during operation, second means coupled to the first current source for providing a control signal ($V_0$) corresponding to the impedance current ($I_1$), and third means comprising a second current source coupled to the second means so as to provide a further current ($I_2$) proportional to the impedance current to an input terminal of the circuit as a function of the control signal, wherein the first current source and the second current source each include a control input for adjusting the current delivered by the respective current source, means for coupling the control signal to the control input of the first current source and to the control input of the second current source, and fourth and fifth means for varying the current delivered by the first current source and the second current source, respectively, as a function of a first adjustment signal ($V_{ref}$) and a second adjustment signal ($V_c$), respectively.

12. An impedance transformation circuit according to claim 11, wherein the fourth means and the fifth means comprise a first current splitter and a second current splitter, respectively, connected in series with a current path of the first current source and a current path of the second current source, respectively, each current splitter having a control input for receiving the first adjustment signal and the second adjustment signal, respectively.

13. An impedance transformation circuit according to claim 11, wherein the fourth and fifth means comprise a first multiplier and a second multiplier, respectively, for providing a first control signal multiplied by the first adjustment signal and a second control signal multiplied by the second adjustment signal, respectively, to the control input of the first current source and to the control input of the second current source, respectively.

14. An impedance transformation circuit according to claim 11, wherein the fourth and fifth means are of a similar type.

15. An impedance transformation circuit according to claim 2 which further comprises fourth and fifth means for varying the current delivered by the first current source and the second current source, respectively, as a function of a first adjustment signal and a second adjustment signal, respectively.

16. An impedance transformation circuit for a two-pole electric impedance, comprising:
  first and second terminals for connection to the electric impedance, control means having an input coupled to the second terminal and having an output for providing a control signal determined by a current flowing through the electric impedance when the electric impedance is connected to said first and second terminals, a first controllable current source having an input coupled to the second terminal such that the first controllable current source is coupled in series circuit with the connected electric impedance to the first terminal and having a control input coupled to the output of the control means for adjusting the current flow in the first current source and in the connected electric impedance, and a second controllable current source having an input coupled to the first terminal and having a control input coupled to the output of the control means thereby to adjust a further current at the first terminal, which further current is a function of the control signal.

17. An impedance transformation circuit for a two-pole electric impedance, comprising:

first and second terminals for connection to the electric impedance, control means having an input coupled to the second terminal and having an output for providing a control signal determined by a current flowing through the electric impedance when the electric impedance is connected to said first and second terminals, a first controllable current source coupled to the second terminal and having a control input coupled to the output of the control means for adjusting the current flow in the first current source and in the connected electric impedance, and a second controllable current source coupled to the first terminal and having a control input coupled to the output of the control means thereby to adjust a further current at the first terminal which further current is a function of the control signal, and wherein the first and second controllable current sources are of a similar type such that the impedance transformation is dependent on the ratio of similar electric properties or parameters of the first controllable current source to the second controllable current source whereby the accuracy of the impedance transformation is relatively independent of manufacturing tolerances of the first and second controllable current source.

18. An impedance transformation circuit as claimed in claim 17 in the form of an integrated circuit.

19. An impedance transformation circuit as claimed in claim 17 further comprising means coupled to said first and second controllable current sources for varying the respective currents delivered thereby as a function of first and second adjustment signals, respectively.

20. An impedance transformation circuit as claimed in claim 16 wherein, said series circuit is connected between the first terminal and a point of reference voltage whereby the current in the first controllable current source and the current in the second controllable current source are dependent on said control signal, said control signal being a function of the current flowing through the electric impedance.

21. An impedance transformation circuit as claimed in claim 1 wherein an input of the second means is coupled to a circuit node between the electric impedance and the first current source.

* * * * *